United States Patent [19]

Arndt

[11] Patent Number: 4,829,356
[45] Date of Patent: May 9, 1989

[54] LATERAL TRANSISTOR WITH BURIED SEMICONDUCTOR ZONE

[75] Inventor: Jürgen Arndt, Obergruppenbach, Fed. Rep. of Germany

[73] Assignee: Telefunken electronic GmbH, Heilbronn, Fed. Rep. of Germany

[21] Appl. No.: 46,534

[22] Filed: May 6, 1987

[30] Foreign Application Priority Data

May 30, 1986 [DE] Fed. Rep. of Germany ....... 3618166

[51] Int. Cl.$^4$ ........................................... H01L 29/72
[52] U.S. Cl. ...................................... 357/35; 357/34; 357/91; 357/23.12; 357/43
[58] Field of Search ................ 357/35, 34, 43, 91, 357/23.12

[56] References Cited

U.S. PATENT DOCUMENTS

| | | |
|---|---|---|
| 4,076,556 | 2/1978 | Agraz-Gvereua et al. ........... 357/35 |
| 4,109,272 | 8/1978 | Herbst et al. ......................... 357/35 |
| 4,115,797 | 9/1978 | Hingarh et al. ....................... 357/35 |
| 4,131,908 | 12/1978 | Daub et al. ............................. 357/35 |
| 4,283,236 | 8/1981 | Sirsi ....................................... 357/35 |
| 4,419,685 | 12/1983 | Sugawara et al. ................. 357/35 X |
| 4,669,177 | 6/1987 | D'Arrigo et al. ...................... 357/35 |

FOREIGN PATENT DOCUMENTS

| | | |
|---|---|---|
| 0008043 | 7/1979 | European Pat. Off. .............. 357/35 |
| 0100677 | 2/1984 | European Pat. Off. . |
| 0152929 | 8/1985 | European Pat. Off. . |
| 0178801 | 4/1986 | European Pat. Off. .............. 357/35 |
| 2420239 | 11/1974 | Fed. Rep. of Germany ........ 357/35 |
| 3023616 | 1/1981 | Fed. Rep. of Germany ........ 357/35 |
| 1100071 | 8/1980 | Japan . |
| 181060 | 10/1984 | Japan ..................................... 357/35 |
| 441512 | 1/1968 | Switzerland .......................... 357/35 |

OTHER PUBLICATIONS

Patent Abstracts of Japan, vol. 4, No. 162 (E-33)[644], Nov. 12, 1980.

Primary Examiner—Andrew J. James
Assistant Examiner—William A. Mintel
Attorney, Agent, or Firm—Spencer & Frank

[57] ABSTRACT

The invention relates to a pnp lateral transistor comprised of two regions of p-type conductivity which are incorporated into the surface of a semiconductor area of n-type conductivity and constitute the emitter and collector the. The portion of the semiconductor area of n-type conductivity located between these two regions constitutes the active base region. The invention is based on the fact that the active base region includes below the semiconductor surface and adjacent to the emitter region and to the collector region, a buried semiconductor region containing additionally counter-doping impurities relative to the remaining surrounding base region area, which buried region produces a conductive channel for the minority charge carriers in the base region. This substantially reduces the parasitic surface recombination and substrate transistor influences and achieves a very high direct current gain in the lateral transistor.

8 Claims, 5 Drawing Sheets

LATERAL TRANSISTOR WITH BURIED SEMICONDUCTOR ZONE

BACKGROUND OF THE INVENTION

The invention relates to a pnp lateral transistor comprised of two regions of a second conductivity type, which constitute emitter and collector regions are incorporated into the surface of a semiconductor area of a first conductivity type. The portion of the semiconductor area of the first conductivity type located between these two regions constitutes the active base region.

Use of lateral pnp bipolar transistors in bipolar integrated circuits to supplement the vertical npn transistors is known. The properties of these lateral transistors, particularly with respect to cutoff frequency, current gain and noise, are clearly inferior to those of complementary vertical pnp transistors. On account of the compatibility of the manufacturing process, these lateral pnp transistors are, however, used world-wide together with vertical npn transistors in integrated circuits.

It is proposed in "IEEE Journal of Solid-State-Circuits" Volume SC-18, No. 3, June 1983, Page 273, that n-channel field-effect transistors be used as lateral npn bipolar transistors in p-well CMOS technology. This proposal may also be applied to an n-well CMOS process, in which case, the p-channel field-effect transistors located in the well are used as lateral pnp transistors.

SUMMARY OF THE INVENTION

The object underlying the invention is to provide a lateral transistor, in particular, a pnp lateral transistor which exhibits substantially improved gain properties in comparison with the aforementioned lateral transistors and which is easily manufacturable in conjunction with the manufacturing process of integrated circuits containing both MOS field-effect transistors and bipolar transistors. This object is achieved in accordance with the invention in a lateral transistor of the kind described at the outset by provision of means for concentrating the minority charge carriers in the active base region at a distance from the semiconductor surface between the emitter region and the collector region. This is preferably attained by the active base region comprising, below the semiconductor surface and adjacent to the emitter region and the collector region, a buried semiconductor region containing additionally counterdoped impurities in relation to the remaining surrounding area of the active base region.

The invention is based on the recognition that two effects are responsible for the unfavorable gain properties of the lateral transistors of the aforementioned known kind:
1. the intense recombination of the minority charge carriers at the surface of the base, at the interface between the isolation oxide and monocrystalline silicon, on account of the charged and the uncharged surface states and the traps prevailing there; and
2. the parasitic substrate transistor arranged, in principle, parallel to each lateral transistor, which drains off part of the minority current injected from the emitter.

These disadvantages are eliminated by the invention by attaining a minority current concentration in the base region between the emitter and the collector in the form of a preferred conductive channel. This decisively reduces the influence of the two parasitic phenomena, namely the surface recombination, on the one hand, and the substrate transistor, on the other hand, particularly when the current is low.

This conductive channel with a lower threshold at the injecting emitter-base junction is produced by implanting doping atoms with a p-type conductivity effect. The implantation energy is so selected that the doping atoms are introduced at a distance from the surface which corresponds to approximately half the vertical extension of the emitter region.

In the pnp lateral transistor, the doping of the buried semiconductor region forming the conductive channel is so selected that there is a reduction in the n-type doping or even a slight p-type redoping in this conductive channel, but the p-type doping is so selected that the normally on state (depletion mode) does not occur in the conductive channel. The inventive lateral transistor is preferably arranged with CMOS field-effect transistors and NPN bipolar transistors on a semiconductor substrate common to all components within an integrated semiconductor circuit. In the manufacture of the lateral transistor in conjunction with CMOS field-effect transistors, the buried conductive channel is fabricated by ion implantation by which the threshold voltage of the field-effect transistors is set by the implantation of charge carriers through the gate insulating layer covering the semiconductor surface.

The invention and its advantageous realization will now be explained in greater detail with reference to embodiments.

BRIEF DESCRIPTION OF THE DRAWINGS

FIGS. 6a to 6k show the successive process steps in the manufacture of an integrated semiconductor circuit comprising both CMOS field-effect transistors and npn vertical transistors and also pnp lateral transistors according to the invention.

The Figures are schematic and are not true to scale. Coincident parts are designated by the same reference numerals in the Figures.

DESCRIPTION OF THE PREFERRED EMBODIMENTS

Figure 1:
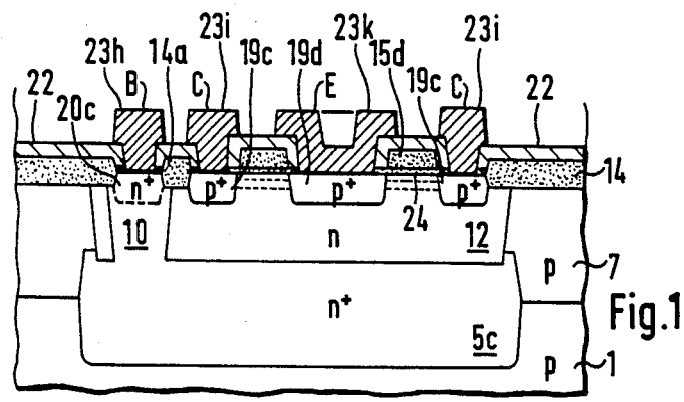
FIG. 1 shows a section through a lateral transistor according to the invention taken on line A—A' of the plan view in FIG. 2.
Figure 2:
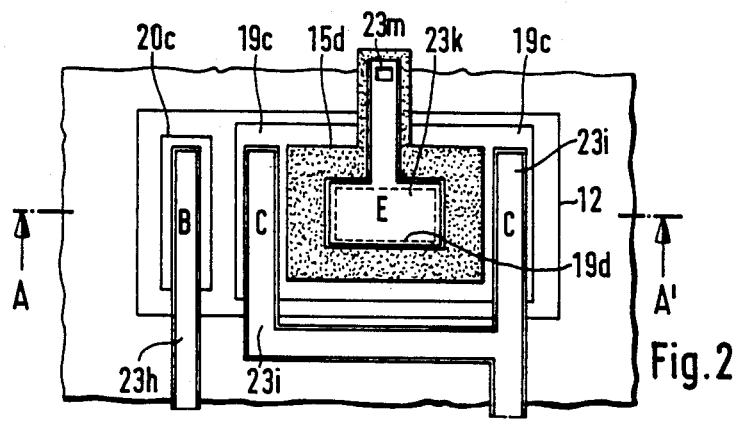

FIG. 1 is a sectional view of a lateral transistor in accordance with the invention, a plan view of which is shown in FIG. 2. The sectional view in FIG. 1 is defined by line A—A' in FIG. 2. The arrangement comprises a monocrystalline semiconductor substrate 1 of p-type conductivity which is supplemented by a lightly doped, epitaxially deposited semiconductor layer 7, similarly of p-type conductivity. A buried area 5c of highly doped n-type conductivity is locally inserted between these. An n-type doped area 12, referred to hereinafter as an n-well, is located above and adjacent to this buried area 5c and is also contiguous to the semiconductor surface.

Arranged in this n-well 12, adjacent to the semiconductor surface is a p+-type conductivity emitter region 19d and concentrically therewith a p+-type conductivity collector region 19c. Arranged between these at the semiconductor surface is an annular gate electrode layer 15d, consisting, for example, of polycrystalline silicon, which is separated from the semiconductor substrate by a layer 24 consisting, for example, of silicon dioxide.

The arrangement, furthermore, comprises a pattern of electrically isolating material 14, in this example, silicon dioxide, which is buried at least partly in the silicon. The pattern of isolation material 14 delimits the n-well area 12 completely and ensures separation of base terminal area 20c and collector area 19c. The n+-type conductivity base terminal region 10 is arranged in the well 12 at the side of the transistor structure and is separated therefrom by the isolating partial area 14a at the semiconductor surface. This terminal region 10 extends into the buried layer 5c. The base contact is designated by 23h, the concentric collector contact by 23i and the emitter contact by 23k. Located between the gate electrode 15d, which, in the pnp lateral transistor according to the invention, is connected to emitter terminal 23m, and the aforementioned contacts 23h-23k is an insulating layer 22 which consists, for example, of highly doped phosphorous glass and is preferably gas-phase deposited.

Figure 3:
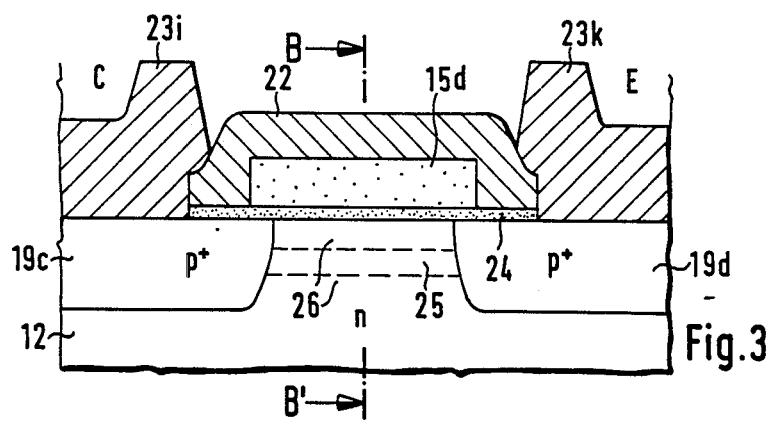
FIG. 3 shows a detail section taken from FIG. 1 which is fundamental to the invention.

The semiconductor region 25 additionally inserted between emitter region 19d and collector region 19c, as is clearly apparent from the detail sectional view in FIG. 3, is of fundamental importance to the properties of the arrangement according to the invention.

Figure 4:
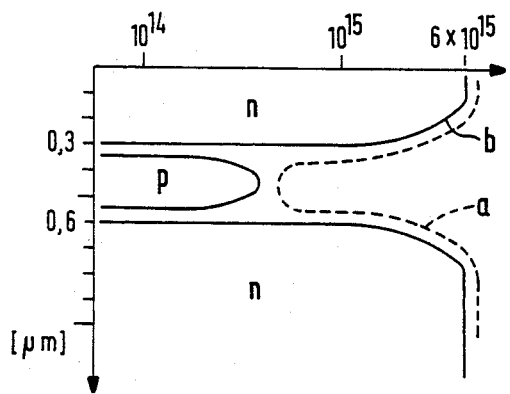
FIG. 4 shows schematically two possible doping profiles through the active base region taken on line B—B' of FIG. 3.

This semiconductor region 25 contains impurities causing additional p-type conductivity, for example, boron, which reduce the n-type conductivity of active base region 26 in an annular area 25 or which redope the n-type conductivity in the area 25 into p-type conductivity, respectively. Two suitable schematic doping profiles a and b, respectively, taken on line B—B' in FIG. 3 are shown in FIG. 4.

In the case of doping profile a, in the buried region 25 forming the conductive channel for the minority charge carriers, the doping of $6 \times 10^{15}$ atoms/cm$^3$ above and below the conductive channel 25 is reduced to approximately $5 \times 10^{14}$ atoms/cm$^3$. In the case of doping profile b, there is a slight redoping to p-type conductivity, but the p-type doping is so minor that a normally on (depletion mode) MOS field-effect transistor is not created. This means that there is no conduction in conductive channel 25 when zero voltage is applied to gate electrode 15d. This is necessary since the parasitic p-channel MOS transistor with source zone 19d, drain zone 19c and gate electrode 15d must be of the normally off (enhancement mode) type with a threshold voltage of $U_{TH} \leq -0.8$ V. This results in a natural limit for the amount of impurities causing p-type conductivity in conductive channel 25. These are introduced, for example, by ion implantation. In embodiment b of FIG. 4, the p-type doping in the conductive channel is approximately $5 \times 10^{14}$ atoms/cm$^3$.

In accordance with the invention, a buried conductive channel 25 for the positive mobile charge carriers (holes) flowing in the base as minority current is, therefore, created in the active base region 26 between emitter region 19d and collector region 19c.

The connection of gate electrode 15d with the emitter terminal, furthermore, ensures that a parasitic current is prevented between the emitter region and the collector region on account of a conductive field-effect transistor.

Figure 5:
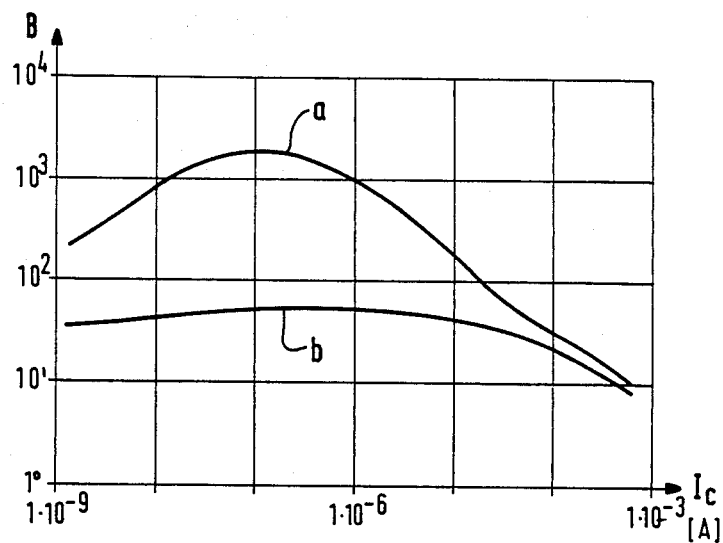
FIG. 5 shows the curve of the direct current gain in a lateral transistor according to the invention in comparison with lateral transistors without a buried conductive channel.

FIG. 5 shows, by way of comparison, the diagrammatic curve of the direct current gain B in common-emitter connection across the collector current $I_C$ in an embodiment of a lateral pnp transistor according to the invention (curve a) and a corresponding transistor without the semiconductor region 25 between the emitter and the collector (curve b). In the case of currents under 1 μA, the semiconductor component according to the invention has a current gain which is more than one order of magnitude higher. The noise characteristics in this current range are also clearly improved by elimination of the influence of the surface. This results in advantageous usability in low-power and low-noise input amplifiers.

The above-described lateral pnp bipolar transistor can be employed with advantage in bipolar CMOS combination technology together with vertical npn bipolar transistors and complementary n-channel and p-channel field-effect transistors. The process steps explained with reference to FIGS. 6a to 6k are used in doing so.

Figure 6A:
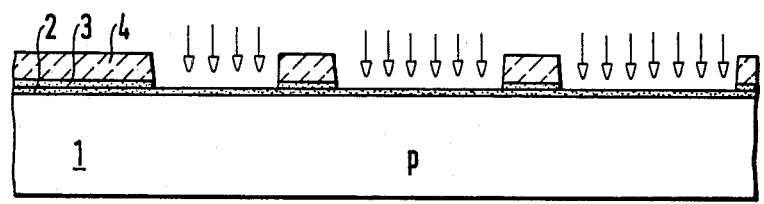

In accordance with FIG. 6a, a silicon oxide layer 2 of approximately 0.07 μm thickness is produced by thermal oxidation on a p-type conductivity silicon substrate 1 with a specific resistance of 1-2 Ωcm. Known techniques are used to produce thereon a silicon nitride layer 3 of 0.1 μm thickness whose uppermost layer of 10 nm is converted into silicon oxide by temperature treatment in water vapor. A mask which masks against oxidation is formed on part of the surface of the substrate by masking with photoresist 4 and then etching layer 3 including its converted surface layer. The structure shown in FIG. 6a is thereby obtained. Arsenic (or antimony) is then introduced by ion implantation into the windows opened in the photoresist mask and n-type conductive semiconductor regions are thereby fabricated.

Figure 6B:
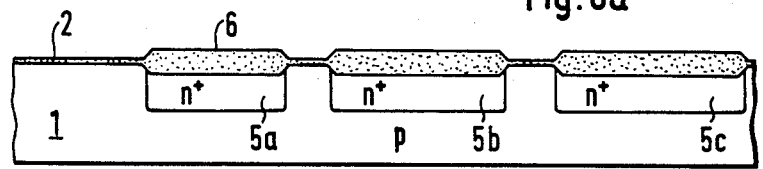

After removal of the photoresist mask, the n+-type conductive semiconductor regions 5a-5c are formed, again by thermal treatment in nitrogen. The surface areas of the silicon which are not covered by the nitride 3 are then oxidized in a wet oxygen atmosphere, and an oxide pattern 6 which is partly sunk in the substrate is formed in the area of the n+-type conductive semiconductor regions 5a-5c (FIG. 6b).

The oxide regions 2 and 6, which are of different thickness, are then removed from the surface by etching in a buffered hydrogen fluoride solution. The steps which are thereby formed at the surface serve to relocate the n+-type doped semiconductor regions 5a-5c.

Figure 6C:
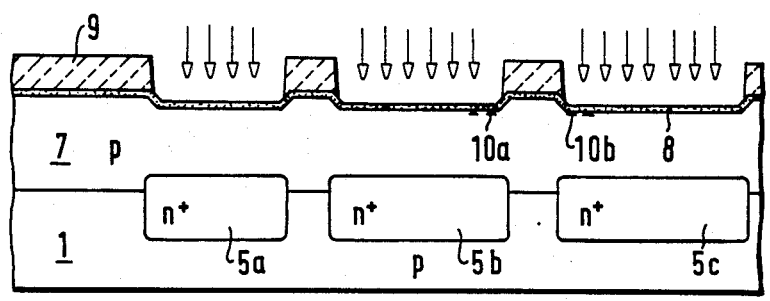
Figure 6D:
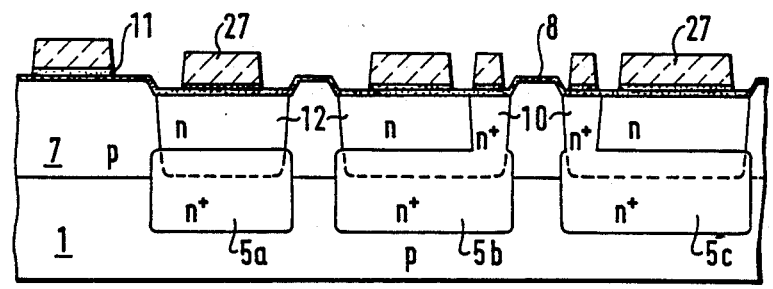

In accordance with FIG. 6c, a p-type conductivity silicon layer 7 of 5 μm thickness and with a specific resistance of approximately 20 Ωcm is then epitaxially grown on substrate 1 using processes which are common in semiconductor technology. A silicon oxide layer 8 of approximately 0.7 μm thickness is then produced thereon by thermal oxidation. Windows, through which the n+-type conductivity semiconductor regions 10a, 10b are produced above partial areas of regions 5b, 5c by implantation of phosphorous ions (dose 1-5·10$^{15}$ cm$^{-2}$), are made by a first masking step in a photoresist layer. Windows, through which the n-type conductive semiconductor regions 12 above regions 5a-5c are produced (FIG. 6d) by implantation of phosphorous ions with a dose of approximately $1-3 \cdot 10^{12}$ cm$^{-2}$, are made by a second masking step in a new photoresist layer 9.

The n+-type terminal regions 10 extending as far as the buried n+-type regions 5b and 5c are created simultaneously with the formation of regions 12.

A silicon nitride layer 11 of 0.1 μm thickness, whose uppermost layer of approximately 10 nm is converted into silicon oxide, again by thermal treatment in water vapor, is deposited on the silicon oxide layer 8. A mask which masks against oxidation is formed on part of the surface of the semiconductor substrate (FIG. 6d) by masking with photoresist 27 and etching layer 11 including its converted surface layer.

Figure 6E:
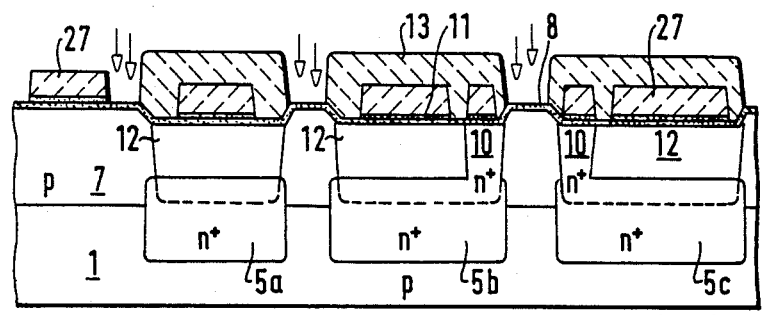

The structured photoresist layer 27 is then made resistant by a "hard bake step" and a further photoresist layer 13 is deposited in accordance with FIG. 6e. Structures are made out of it for covering the n-type conductive semiconductor regions 5a-5c during the following implantation of boron ions with a dose of $1-4 \cdot 10^{13}$ cm$^{-2}$ into the p-type conductivity surface regions in layer 7 (FIG. 6e) to avoid later surface inversion. This double photoresist step enables self-aligning of the field implantation with the regions of the active components in the p-type conductive surface area.

Figure 6F:
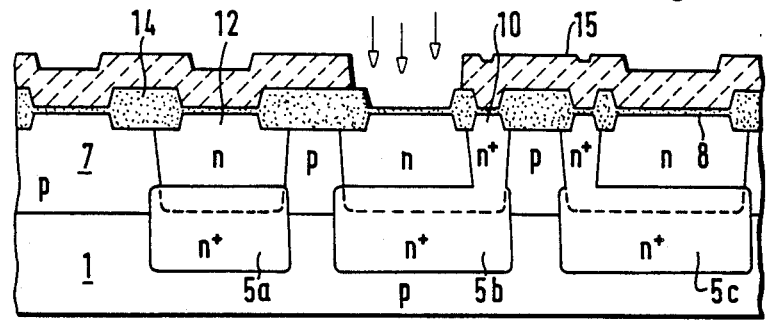

After removal of the double photoresist mask 27, 13, the surface parts of the silicon which are not covered by nitride are oxidized in a wet oxygen atmosphere, and a field oxide pattern 14 which as shown in FIG. 6f is partly recessed in the substrate, is formed.

Windows for the base of the npn transistors are formed with the aid of a photoresist layer 15 and boron ions with a dose of $8 \cdot 10^{13}-4 \cdot 10^{14}$ cm$^{-2}$ are implanted into these windows.

Figure 6G:
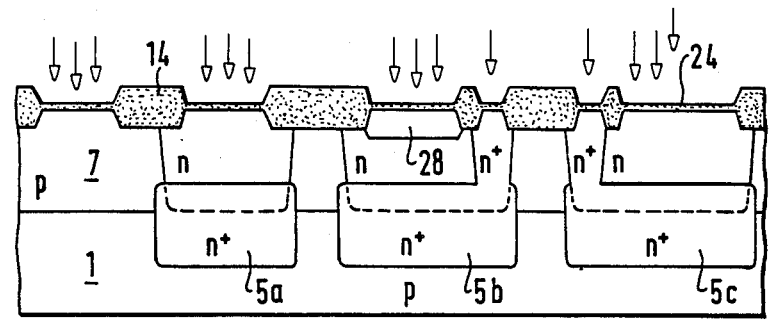

Resist layer 15 is then removed and the p-type conductivity base regions 28 are formed from the implanted impurity. This is achieved by a diffusion process at approximately 1050 degrees C. in an inert atmosphere. The thin oxide 8 is removed without mask and a gate oxide layer 24 is subsequently produced by thermal oxidation in dry oxygen with the addition of HCl (FIG. 6g). Boron ions with two different energies are implanted through this gate oxide 24 to set the threshold voltage of the field-effect transistors: a flat implantation with 30-50 KV acceleration voltage and a deep implantation with 160-200 KV acceleration voltage. By optimizing the division of the total dose of approximately $4-7 \cdot 10^{11}$ cm$^{-2}$ into the two implantations, a symmetrical threshold voltage of $-0.8$ V and $+0.8$ V, respectively, can be set for p-channel and n-channel field-effect transistors. The semiconductor region 25 as shown in FIG. 3 which imparts the desired gain property to the semiconductor arrangement in accordance with the invention is simultaneously formed.

Figure 6H:
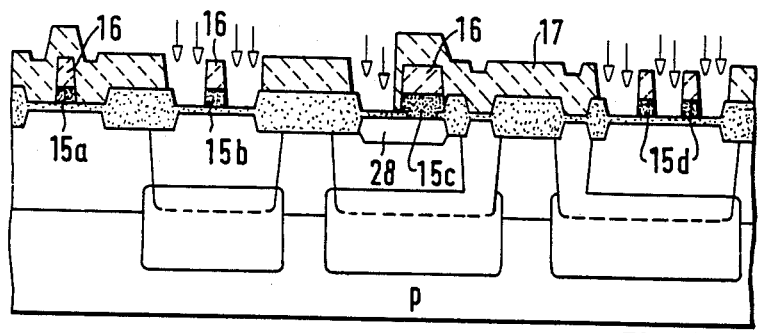

In accordance with FIG. 6h, an opening for emitter 15c of the npn transistor above base region 28 is then formed in the gate oxide by a photoresist step with a subsequent oxide etching step. With the aid of a known LPCVD process, an undoped polysilicon layer is deposited thereon and made n-type conductive with a phosphorous implantation throughout the entire surface with a dose of $1-2 \cdot 10^{16}$ cm$^{-2}$.

Gate electrodes 15a, 15b of the field-effect transistors, the emitter electrode 15c of the npn bipolar transistor and the polysilicon ring 15d for the lateral pnp bipolar transistor are formed (FIG. 6h) by masking with a photoresist 16 and subsequent etching of the polysilicon in a plasma reactor.

The structured photoresist layer 16 is then made resistant by temperature treatment and a further photoresist layer 17 is deposited.

In this photoresist layer 17, windows for the source zone and the drain zone of the p-channel field-effect transistor 19a, for the base terminal 19b of the npn transistor and for the collector 19c and the emitter 19d of the pnp transistor are opened and boron ions with a dose of $4-8 \cdot 10^{15}$ cm$^{-2}$ are implanted. The n-type conductivity polysilicon 15a-15d is protected against penetration of compensating boron ions by the photoresist layer 16 which is still present.

Figure 6I:
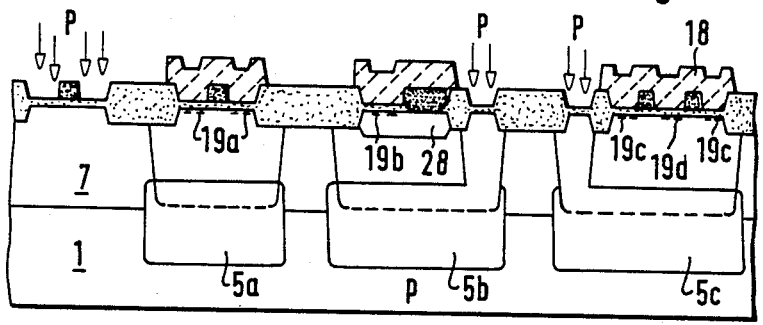

After removal of photoresist layers 16 and 17, a new photoresist layer 18 as shown in FIG. 6i is deposited and the n+-type conductivity source zone and drain zone 20a (FIG. 6k) of the n-channel field-effect transistor, the collector terminal 20b (FIG. 6k) of the npn transistor and the base terminal 20c (FIG. 6k) of the pnp transistor are implanted with phosphorous or arsenic ions respectively, with a dose of $5-10 \cdot 10^{15}$ cm$^{-2}$ through opened windows.

After removal of photoresist layer 18, the p+-type conductivity areas 19a-19d, the n+-type conductivity areas 20a-20c and the n+-type conductivity emitter 21 (FIG. 6k) are simultaneously formed by thermal treatment from the impurities which have been introduced. An oxide layer 22 of approximately 0.8 μm thickness is then produced on the entire arrangement, contact holes are provided, and, finally, an aluminum layer is vapor-deposited and metallic conductive paths 23a-23i for the terminals are made therein by a photolithographic etching procedure.

Annealing is carried out for 30 minutes at 450 degrees C. in forming gas ($N_2+H_2$) before the properties of the individual components can be measured.

Figure 6K:
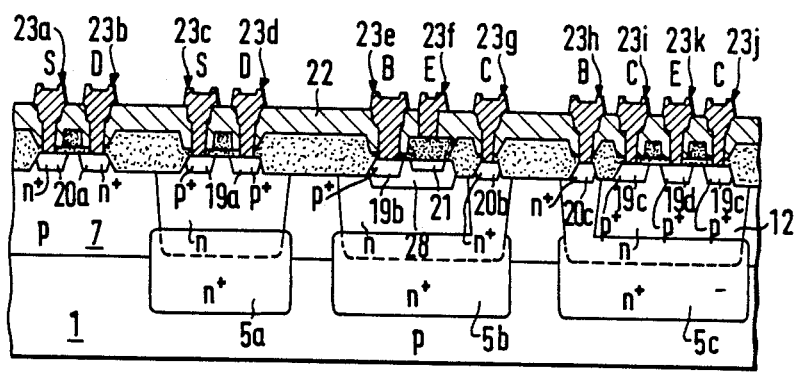

The arrangement illustrated in FIG. 6k consequently comprises from the left to the right: an n-channel field-effect transistor, a p-channel field-effect transistor, an npn vertical transistor and a pnp lateral transistor. In this way, complex integrated circuits containing these and other semiconductor components, with the lateral transistors of the pnp type comprising the conductive channel according to the invention between the collector region and the emitter region, can be constructed without additional work expenditure.

What is claimed is:

1. In a lateral transistor comprised of two regions of a second conductivity type, which constitute the emitter region and the collector region, incorporated into the surface of a semiconductor region of a first conductivity type, with the portion of the semiconductor region of the first conductivity type located between said two regions consituting the active base region of said transistor; the improvement wherein: said active base region includes a buried semiconductor zone which is disposed below and spaced from said surface and extends to said emitter and collector region, with said buried semiconductor zone containing additional counterdoping impurities relative to the conductivity of the remaining surrounding portions of said active base region, thus concentrating the minority charge carriers in the active base region at a distance from the semiconductor surface between the emitter region and the collector region.

2. A lateral transistor as defined in claim 1 wherein said buried semiconductor zone is of the first conductivity type with its doping concentration being substantially reduced relative to the remaining surrounding portion of said base region.

3. A lateral transistor as defined in claim 1 wherein said buried semiconductor zone is of the second conductivity type, but is so weakly doped that it is not in the normally on state (depletion mode).

4. A lateral transistor as defined in claim 1 wherein said transistor is a pnp lateral transistor.

5. A lateral transistor as defined in claim 1 wherein said buried semiconductor zone is spaced approximately 0.3 μm from said semiconductor surface, reaches a penetration depth of approximately 0.6 μm from said surface, and has a doping concentration of between $10^{14}$ and $10^{16}$ atoms/cm$^3$.

6. A lateral transistor as defined in claim 1 wherein said active base region is covered at said semiconductor surface with a passivation layer on which an electrode layer connected to the emitter contact is arranged.

7. A lateral transistor as defined in claim 6 wherein said electrode layer consists of conductive polycrystalline silicon and said passivation layer arranged thereunder is composed of silicon dioxide or silicon nitride.

8. A lateral transistor as defined in claim 4 wherein said pnp lateral transistor is arranged together with CMOS field-effect transistors and npn bipolar transistors on a semiconductor substrate which is common to all components.

* * * * *